(12) United States Patent
Cowley et al.

(10) Patent No.: US 7,672,657 B2
(45) Date of Patent: Mar. 2, 2010

(54) TUNABLE FILTER APPARATUS, SYSTEMS, AND METHODS

(75) Inventors: Nick Cowley, Wroughton (GB); David Albert Sawyer, Swindon (GB)

(73) Assignee: Intel Corporation, Santa Clara, CA (US)

( * ) Notice: Subject to any disclaimer, the term of this patent is extended or adjusted under 35 U.S.C. 154(b) by 652 days.

(21) Appl. No.: 11/427,045

(22) Filed: Jun. 28, 2006

(65) Prior Publication Data

US 2008/0003970 A1    Jan. 3, 2008

(51) Int. Cl.
*H04B 1/10* (2006.01)

(52) U.S. Cl. .................... 455/307; 455/193.1; 455/339; 455/213; 327/533; 327/552; 327/557; 348/731; 348/725

(58) Field of Classification Search ................. 455/307, 455/193.1, 339, 213; 327/533, 552, 557; 348/731, 725
See application file for complete search history.

(56) References Cited

U.S. PATENT DOCUMENTS

| | | | |
|---|---|---|---|
| 3,737,801 A * | 6/1973 | Adams et al. .................. | 331/53 |
| 4,875,019 A * | 10/1989 | Monson et al. ............. | 330/302 |
| 5,715,281 A | 2/1998 | Bly et al. | |
| 5,852,630 A | 12/1998 | Langberg et al. | |
| 6,009,126 A | 12/1999 | Van Bezooijen | |
| 6,647,074 B2 | 11/2003 | Citta et al. | |
| 6,735,422 B1 | 5/2004 | Baldwin et al. | |
| 7,304,533 B2 * | 12/2007 | Hisayasu et al. ............ | 327/553 |
| 2003/0042984 A1 | 3/2003 | Moloudi et al. | |
| 2003/0112370 A1 | 6/2003 | Long et al. | |
| 2005/0190777 A1 | 9/2005 | Hess | |
| 2005/0243217 A1 * | 11/2005 | Yun et al. .................... | 348/725 |
| 2007/0211837 A1 * | 9/2007 | Zipper ........................ | 375/350 |
| 2008/0049875 A1 | 2/2008 | Cowley et al. | |

OTHER PUBLICATIONS

"Emitter Degeneration", www.electronics-tutorials.com, http://web.archive.org/web/20050305151425/http://www.electronics-tutorials.com/amplifiers/emitter-degeneration.htm, (archived Mar. 5, 2005), 4 pgs.
200710146891.1, Chinese Application Serial No.—200710146891.1 Office Action mailed Dec. 8, 2008, 5 pgs.
"Chinese Application Serial No. 200710138878.1, Office Action mailed Apr. 9, 2009", 22 pgs.
"U.S. Appl. No. 11/467,390, Non-Final Office Action mailed Sep. 3, 2009", 21 Pgs.
"U.S. Appl. No. 11/467,390, Response filed Dec. 3, 2009 to Non Final Office Action mailed Sep. 3, 2009", 13 pgs.

* cited by examiner

*Primary Examiner*—Sanh D Phu
(74) *Attorney, Agent, or Firm*—Schwegman, Lundberg & Woessner, P.A.

(57) ABSTRACT

Embodiments of an active bandpass filter are described. Such a filter includes a transistor; a series-tuned inductive-capacitive (LC) network (STLCN) in a common source circuit associated with the transistor to produce a tuned degenerative filtering of at least one interfering signal; and a first, variable resistance associated with the STLCN to provide a first control of a resonance quality factor (Q) associated with the filter. Other embodiments may be described and claimed.

16 Claims, 3 Drawing Sheets

TUNABLE FILTER APPARATUS, SYSTEMS, AND METHODS

TECHNICAL FIELD

Various embodiments described herein relate to electronic communications generally, including apparatus, systems, and methods associated with radio-frequency (RF) filters.

BACKGROUND INFORMATION

Traditional RF tuners may be used to receive terrestrial or cable broadcast signals in the range of about 50 megahertz (MHz) to 860 MHz. Such tuners may employ single conversion intermediate frequency (IF) technology. A single conversion tuner may mix a received RF signal with a local oscillator (LO) signal in a single mixing stage to produce an IF signal. A common IF frequency may be about 36 MHz, for example.

The tuner may include a number of tracking filters used to protect a desired channel from interfering signals. Certain interfering signals, including an image channel and intermodulation products, may be generated in a subsequent stage without the tracking filters. The image channel may lie above the desired channel at twice the IF output frequency, for a tuner utilizing high side mixing. The image channel may be particularly problematic, because it may lie directly on a desired channel after an IF conversion. A tracking filter may be centered on the desired channel to suppress one or more undesired channels prior to conversion.

Some tuner front-ends may include RF circuitry for a number of sub-bands, for coverage of a full broadcast spectrum. An RF circuit associated with each sub-band may include a tracking filter of substantially identical design to tracking filters associated with the other sub-bands.

Some tuners may include a first tracking filter comprising a single inductor-capacitor resonant network located prior to an automatic gain control (AGC) stage. A center frequency associated with the first tracking filter may track with a center frequency of the desired channel. The first tracking filter may select the desired channel from the full received spectrum and may provide a first attenuation to the undesired channels, including the image channel. This may provide protection from intermodulation that might otherwise be generated in a subsequent stage.

A second tracking filter may comprise two resonant networks arranged as a double-tuned, loosely-coupled structure. The second tracking filter may be located prior to a conversion stage. A center frequency associated with the second tracking filter may track the desired channel frequency. The second tracking filter may provide a higher resonant quality factor (Q) attenuation to the undesired channels, including the image channel.

In a typical implementation, the tracking filters may be replicated for each segmented band. The tracking filters may be formed from numerous discrete components, including varactor diodes and air coils. An inductance value associated with the air coils may vary from a few hundred nanohenries (nHs) in the low band to a few nHs in the high band. The air coil inductors may be characterised by a high Q factor, typically in excess of 50, and may require manual adjustment. A tracking filter thus composed may not be suitable for semiconductor integration.

DETAILED DESCRIPTION

Figure 1:
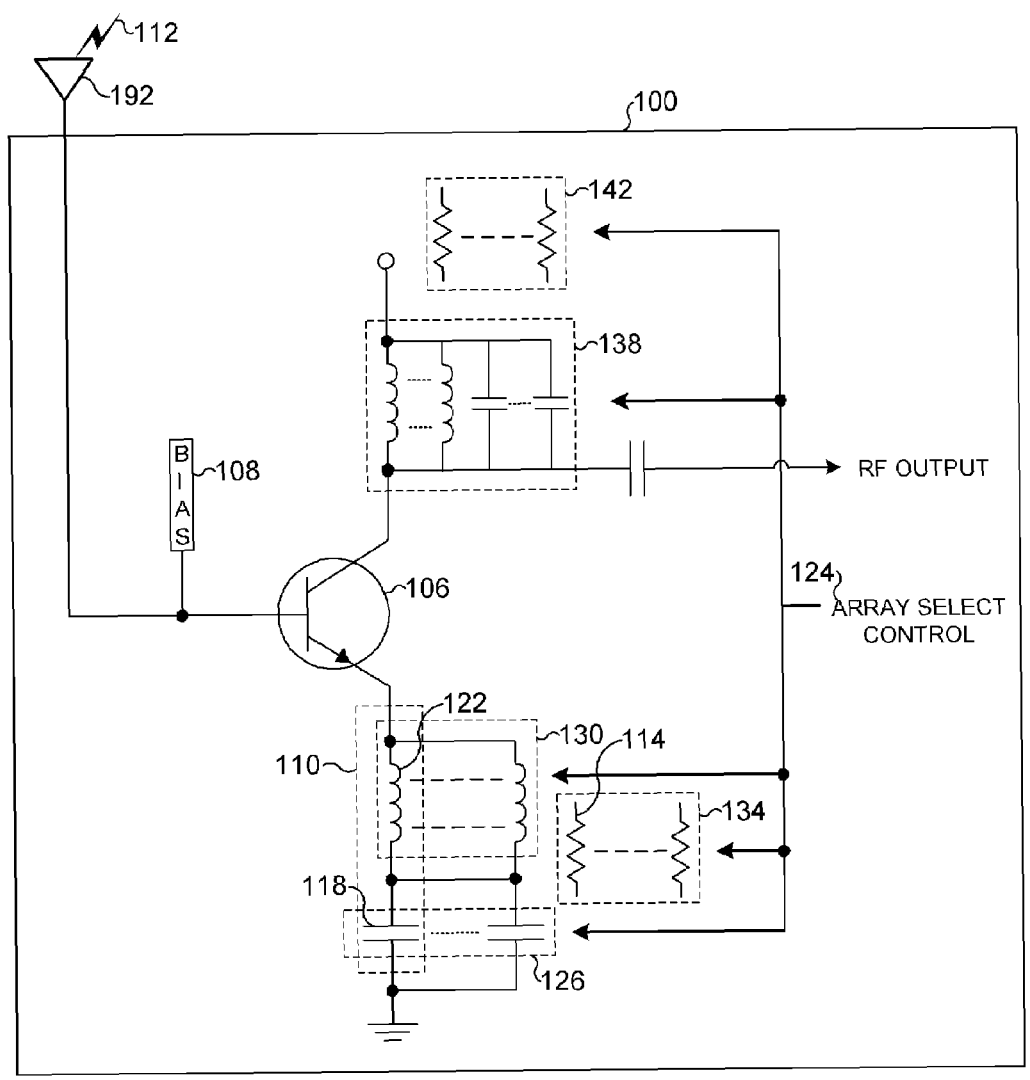
FIG. 1 is a block diagram of an apparatus and a representative system according to various embodiments.

FIG. 1 comprises a block diagram of a filter 100 and a system 190 according to various embodiments of the invention. The filter 100 may comprise a transistor 106. The transistor 106 may comprise a bipolar transistor or a field-effect transistor (FET) (not shown), among other types. A biasing element 108 may be coupled to the transistor 106 to create a standing current. The filter 100 may be integrated into one or more semiconductor circuits.

The filter 100 may also include a series-tuned inductive-capacitive (LC) network (STLCN) 110. The STLCN 110 may be located in a common emitter circuit in the case of the bipolar transistor. The STLCN 110 may be located in a common source circuit in the case of a FET (not shown). The STLCN 110 may result in a tuned degenerative filtering of one or more interfering signals 112. That is, negative feedback may increase with increasing frequency offsets from a center bandpass frequency and may reduce gain for the increasing frequency offsets. Additionally, boosted feedback for increasing frequency offsets may increase linearity. A decrease in a magnitude of intermodulation products may result.

A resistance 114 may be associated with the STLCN 110. The resistance 114 may be in series with the STLCN 110. In some embodiments, the resistance 114 may be in parallel with a selected capacitive element 118 associated with the STLCN 110, with a selected inductive element 122 associated with the STLCN 110, or with both. In some embodiments, the resistance 114 may be distributed at multiple nodes of the STLCN 110. The resistance 114 may provide a first control of a Q associated with the filter 100.

In some embodiments of the filter 100, the resistance 114, the selected capacitive element 118, and/or the selected inductive element 122 may be selected using an array select control 124. The array select control 124 may be digital or analog. The selected capacitive element 118 may be selected from a switched capacitive array 126. The selected inductive element 122 may be selected from a switched inductive array 130. One or more elements may be combined from the switched capacitive array 126 and from the switched inductive array 130 to approximate a desired value of the selected capacitive element 118 and a desired value of the selected inductive element 122, respectively.

In some embodiments, the resistance 114 may comprise a variable resistance. Alternatively, the resistance 114 may be selected from an array of resistive elements 134.

The filter 100 may also include a parallel-tuned LC network (PTLCN) 138. The PTLCN 138 may be located in a collector circuit associated with the transistor 106, in the case of a bipolar transistor type. The PTLCN 138 may be located in a drain circuit in the case of a FET (not shown). The PTLCN 138 may enhance the tuned degenerative filtering and may provide a second control of the Q associated with the filter 100. That is, the PTLCN 138 may add one or more poles to a transfer function associated with the filter 100. The PTLCN 138 may comprise one or more switched capacitive and/or inductive arrays. Capacitances and/or inductances may be selected from the arrays using the array select control 124.

A resistance 142 may be associated with the PTLCN 138. The resistance 142 may be located in series or in parallel with capacitive and/or inductive elements comprising the PTLCN 138. The resistance 142 may provide a third control of the Q associated with the filter 100. The resistance 142 may comprise a variable resistance and/or may be selected from a switched array of resistive elements. The resistive elements may be selected using the array select control 124.

The STLCN, the PTLCN, or both may comprise one or more cascaded tuned LC networks. The cascaded tuned LC network(s) may provide a composite attenuation of the interfering signals.

In a further embodiment, a system 190 may include one or more of the filter 100. The system 190 may also include an antenna 192. The antenna 192 may comprise a patch antenna, a directional antenna, an omnidirectional antenna, a beam antenna, a slot antenna, a monopole antenna, or a dipole antenna, among other types. The antenna 192 may be operatively coupled to the transistor 106 to receive the interfering signals.

Any of the components previously described may be implemented in a number of ways. Thus, the filter 100; the transistor 106, the biasing element 108; the STLCN 110; the interfering signal(s) 112; the resistances 114, 142; the selected capacitive element 118; the selected inductive element 122; the array select control 124; the arrays 126, 130, 134; the PTLCN 138; the system 190; and the antenna 192 may all be characterized as "modules" herein.

The modules may include hardware circuitry, single or multi-processor circuits, memory circuits and combinations thereof, as desired by the architect of the filter 100 and the system 190 and as appropriate for particular implementations of various embodiments.

The apparatus and systems of various embodiments may be useful in applications other than an active, tunable RF bandpass filter capable of semiconductor integration. Thus, various embodiments of the invention are not to be so limited. The illustrations of the filter 100 and the system 190 are intended to provide a general understanding of the structure of various embodiments. They are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, modems, single or multi-processor modules, single or multiple embedded processors, multi-core processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others. Some embodiments may include a number of methods.

Figure 2:
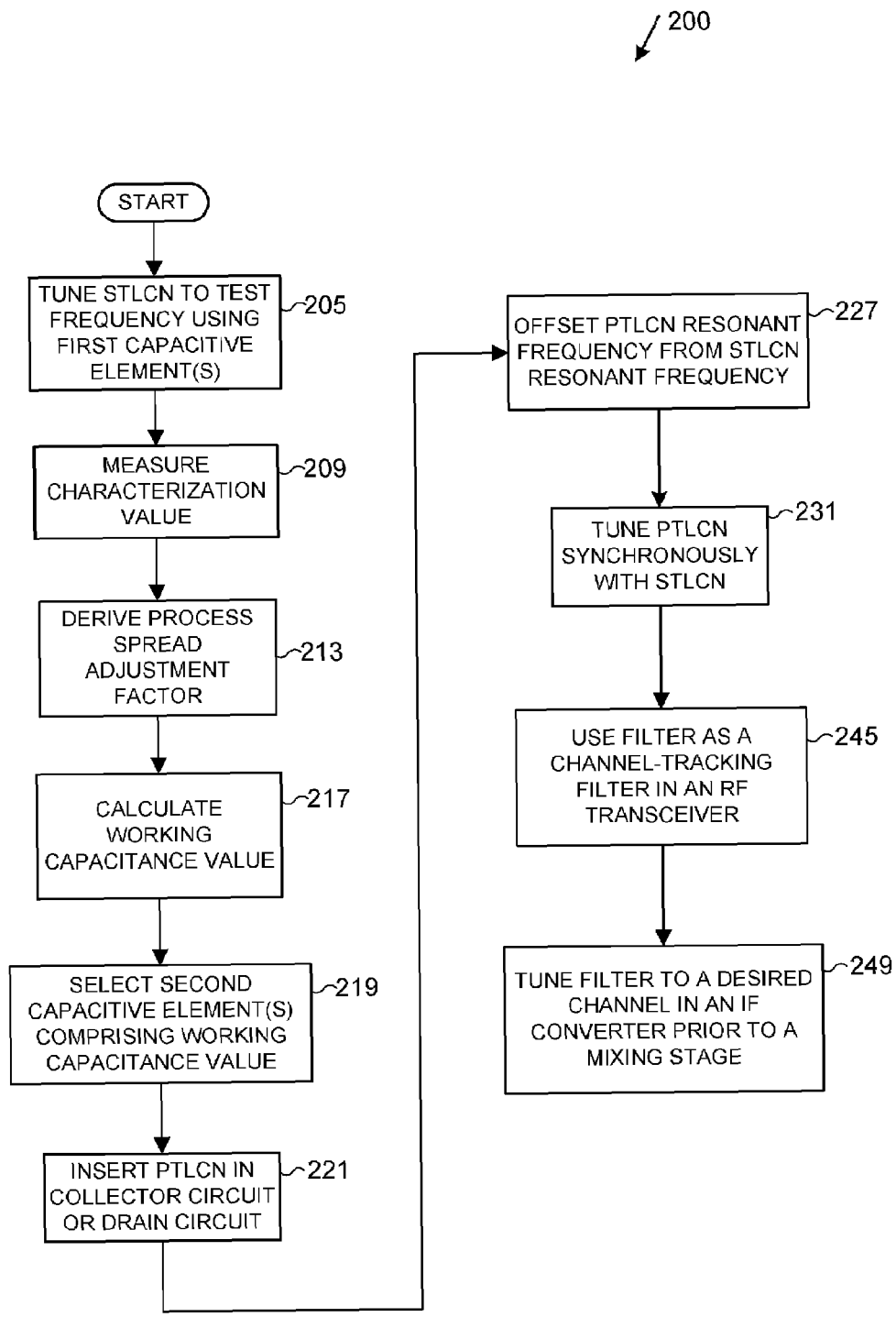
FIG. 2 is a flow diagram illustrating several methods according to various embodiments.

FIG. 2 is a flow diagram illustrating several methods according to various embodiments. A method 200 may use a filter to remove one or more interfering signals of an undesired frequency. The filter may include a transistor, comprising perhaps a bipolar transistor or a FET, among other types. An STLCN in a common emitter circuit associated with the bipolar transistor or in a common source circuit associated with the FET may create a tuned degenerative filter for filtering the interfering signals. A resistance associated with the STLCN may control a Q associated with the filter, as previously described. In some embodiments, a capacitor or an inductor associated with the STLCN may be selectable from an array of each of these elements, respectively. The resistance may also comprise a variable resistance, a distributed resistance, or a resistance selected from an array of resistive elements.

The method 200 may utilize a process spread characterization routine to measure and to compensate for manufacturing process variations in an array of tuning elements. Although the following description exemplifies this routine for a capacitive array, the method may apply equally to an inductive array.

The method 200 may commence at block 205 with tuning the STLCN to a known test frequency using one or more first capacitive elements. The first capacitive elements may be selected from a switched capacitive array, such that a signal of the known test frequency applied at an input of the filter produces a peak response at an output of the filter. The process spread characterization routine may then measure a characterization value (e.g., a capacitance) of the first capacitive elements, at block 209. The method 200 may continue at block 213 with deriving a process spread adjustment factor using the characterization value. For example, suppose that a resonant frequency calculation for the known test frequency yields a nominal value of 50 picofarads (pf) for the first capacitive element, and the characterization value is measured as 45 pf. A process spread adjustment factor of 5 pf may be applied to future selections of capacitive elements on dies from the same manufacturing lot.

The method 200 may thus include calculating a working capacitance value for a desired resonant frequency using the process spread adjustment factor, at block 217. One or more second capacitive elements may be selected from the switched capacitive array to provide the working capacitance value, at block 219.

The method 200 may also include inserting a PTLCN in a collector circuit associated with the bipolar transistor or in a drain circuit associated with the FET, at block 221. The PTLCN may be used to adjust the Q associated with the filter. Some embodiments may determine a Nyquist shape (a shape of a bandpass curve) in other ways. For example, a first resonant frequency associated with the PTLCN may be offset from a second resonant frequency associated with the STLCN to control the Nyquist shape associated with the filter, at block 227.

The method 200 may further include tuning the PTLCN synchronously with the STLCN, at block 231. The method 200 may include using the filter as a channel tracking filter in an RF receiver or transceiver, at block 245. The method 200 may terminate at block 249 with tuning the filter to a desired channel in an IF converter prior to a mixing stage. In some embodiments, the IF converter may comprise a zero-IF (ZIF) converter utilizing a quadrature mixing stage.

It may be possible to execute the activities described herein in an order other than the order described. And, various activities described with respect to the methods identified herein may be executed in repetitive, serial, or parallel fashion.

A software program may be launched from a computer-readable medium in a computer-based system to execute functions defined in the software program. Various programming languages may be employed to create software programs designed to implement and perform the methods disclosed herein. The programs may be structured in an object-orientated format using an object-oriented language such as Java or C++. Alternatively, the programs may be structured in a procedure-orientated format using a procedural language, such as assembly or C. The software components may communicate using a number of mechanisms well known to those skilled in the art, such as application program interfaces or inter-process communication techniques, including remote procedure calls. The teachings of various embodiments are not limited to any particular programming language or environment. Thus, other embodiments may be realized, as discussed regarding FIG. 3 below.

Figure 3:
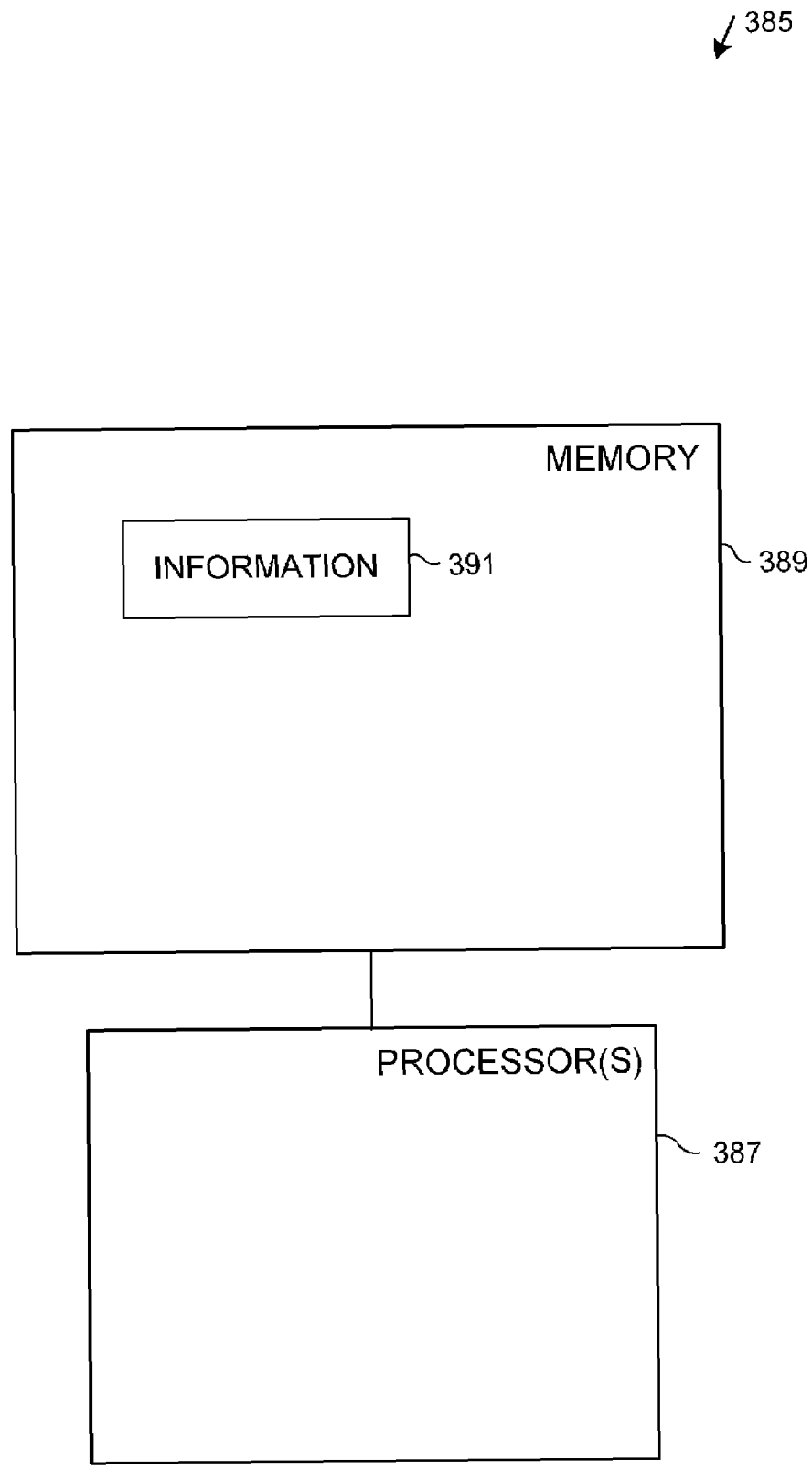
FIG. 3 is a block diagram of an article according to various embodiments.

FIG. 3 is a block diagram of an article 385 according to various embodiments of the invention. Examples of such embodiments may comprise a computer, a memory system, a magnetic or optical disk, some other storage device, or any type of electronic device or system. The article 385 may include one or more processor(s) 387 coupled to a machine-accessible medium such as a memory 389 (e.g., a memory including electrical, optical, or electromagnetic elements). The medium may contain associated information 391 (e.g., computer program instructions, data, or both) which, when accessed, results in a machine (e.g., the processor(s) 387) performing the activities previously described.

Implementing the apparatus, systems, and methods disclosed herein may enable a semiconductor integration of an active RF bandpass filter with a tunable center frequency and an adjustable Nyquist shape.

Embodiments of the present invention may be implemented as part of a wired or wireless system. Examples may also include embodiments comprising multi-carrier wireless communication channels (e.g., orthogonal frequency division multiplexing (OFDM), discrete multitone (DMT), etc.) such as may be used within a wireless personal area network (WPAN), a wireless local area network (WLAN), a wireless metropolitan area network (WMAN), a wireless wide area network (WWAN), a cellular network, a third generation (3G) network, a fourth generation (4G) network, a universal mobile telephone system (UMTS), and like communication systems, without limitation.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A filter, including:
   a transistor;
   a series-tuned inductive-capacitive (LC) network (STLCN) in a common source circuit associated with the transistor to produce a tuned degenerative filtering of at least one interfering signal; and
   a first, variable resistance associated with the STLCN to provide a first control of a resonance quality factor (Q) associated with the filter,
   wherein at least one of a selected inductive element associated with the STLCN or a selected capacitive element associated with the STLCN is capable of digital selection.

2. The filter of claim 1, wherein the transistor comprises at least one of a bipolar transistor or a field-effect transistor.

3. The filter of claim 1, further including:
   a switched inductive array from which to select the inductive element.

4. The filter of claim 1, further including:
   a switched capacitive array from which to select the capacitive element.

5. The filter of claim 1, wherein the first, variable resistance is selected from an array of resistive elements.

6. The filter of claim 1, further including:
   a parallel-tuned LC network (PTLCN) in a drain circuit associated with the transistor to enhance the tuned degenerative filtering and to provide a second control of the Q associated with the filter; and
   a second resistance, the second resistance associated with the PTLCN to provide a third control of the Q associated with the filter.

7. The filter of claim 6, wherein at least one of the STLCN or the PTLCN comprises a cascaded tuned LC network to provide a composite attenuation of the at least one interfering signal.

8. The filter of claim 1, wherein the filter is included in an integrated circuit.

9. The filter of claim 1, further including:
   a biasing element coupled to the transistor to create a standing current.

10. A system, including:
    a transistor;
    a series-tuned inductive-capacitive (LC) network (STLCN) in a common source circuit to create a tuned degenerative filter for filtering at least one interfering signal;
    a variable resistance associated with the STLCN to provide a first control of a resonance quality factor (Q) associated with the filter; and
    a directional antenna operatively coupled to the transistor to receive the at least one interfering signals
    wherein a capacitive element associated with the STLCN can be selected from an array of capacitive elements.

11. The system of claim 10, wherein the transistor comprises a field-effect transistor.

12. The system of claim 10, wherein an inductive element associated with the STLCN is selected from an array of inductive elements.

13. The system of claim 10, further including:

a parallel-tuned LC network in at a drain circuit to enhance the tuned degenerative filter and to provide a second control of the Q associated with the filter.

14. An article including a machine-accessible medium having associated information, wherein the information, when accessed, results in a machine performing:

selecting at least one of an inductor from a switched inductive array and a capacitor from a switched capacitive array to tune a tracking filter to remove at least one interfering signal of an undesired frequency, wherein the tracking filter comprises:

a transistor;

a series-tuned inductive-capacitive network (STLCN) in a common source circuit to produce a tuned degenerative filtering of at least one interfering signal; and a variable resistance associated with the STLCN to control a resonance quality factor associated with the filter.

15. The article of claim 14, wherein the information, when accessed, results in a machine performing:

tuning the filter to a desired channel in an intermediate frequency (IF) converter prior to a mixing stage.

16. The article of claim 15, wherein the IF converter comprises a zero-IF converter and the mixing stage comprises a quadrature mixing stage.

* * * * *

UNITED STATES PATENT AND TRADEMARK OFFICE
CERTIFICATE OF CORRECTION

PATENT NO. : 7,672,657 B2
APPLICATION NO. : 11/427045
DATED : March 2, 2010
INVENTOR(S) : Nick Cowley et al.

It is certified that error appears in the above-identified patent and that said Letters Patent is hereby corrected as shown below:

In column 6, line 60, in Claim 10, delete "signals" and insert -- signal, --, therefor.

In column 7, line 2, in Claim 13, delete "in at" and insert -- in --, therefor.

Signed and Sealed this

Eighteenth Day of May, 2010

David J. Kappos
*Director of the United States Patent and Trademark Office*